(12) United States Patent
Ogawa

(10) Patent No.: US 11,209,093 B2
(45) Date of Patent: Dec. 28, 2021

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 103 days.

(21) Appl. No.: 16/630,730

(22) PCT Filed: Jun. 19, 2018

(86) PCT No.: PCT/JP2018/023312
§ 371 (c)(1),
(2) Date: Jan. 13, 2020

(87) PCT Pub. No.: WO2019/012926
PCT Pub. Date: Jan. 17, 2019

(65) Prior Publication Data
US 2021/0148479 A1   May 20, 2021

(30) Foreign Application Priority Data

Jul. 14, 2017  (JP) .............................. JP2017-138014

(51) Int. Cl.
| F16K 17/18 | (2006.01) |
| B65D 85/30 | (2006.01) |
| F16K 7/02  | (2006.01) |
| F16K 15/02 | (2006.01) |

(52) U.S. Cl.
CPC .............. *F16K 17/18* (2013.01); *B65D 85/30* (2013.01); *F16K 7/02* (2013.01); *F16K 15/02* (2013.01)

(58) Field of Classification Search
None
See application file for complete search history.

(56) References Cited

U.S. PATENT DOCUMENTS

| 3,298,391 A | 1/1967 | Savage |
| 6,319,297 B1 * | 11/2001 | Fosnight .............. B01D 46/008 |
| | | 141/98 |
| 7,328,727 B2 * | 2/2008 | Tieben .............. H01L 21/67379 |
| | | 141/11 |

(Continued)

FOREIGN PATENT DOCUMENTS

| JP | 2004179449 A | 6/2004 |
| JP | 200866330 A | 3/2008 |
| JP | 2009277687 A | 11/2009 |

*Primary Examiner* — Daphne M Barry
(74) *Attorney, Agent, or Firm* — The Webb Law Firm

(57) ABSTRACT

A substrate storage container is provided with a valve body attached thereto which includes a first cylindrical portion having one end communicating with the outside of a container body, a second cylindrical portion having one end communicating with the interior of the container body and spaced apart from the other end of the first cylindrical portion, a plug member positioned between the other end of the first cylindrical portion and the other end of the second cylindrical portion, and an elastic body that covers at least the plug member and has an inner diameter equal to or smaller than the outer diameter of the plug member, and wherein gas flow to the container body is controlled by close contact between the plug member and the elastic body.

18 Claims, 7 Drawing Sheets

(56) References Cited

U.S. PATENT DOCUMENTS

| | | | | |
|---|---|---|---|---|
| 7,400,383 | B2 * | 7/2008 | Halbmaier | H01L 21/67389 |
| | | | | 206/449 |
| 7,455,180 | B2 * | 11/2008 | Sumi | F16K 15/026 |
| | | | | 137/508 |
| 8,091,592 | B2 * | 1/2012 | Sato | F16K 15/063 |
| | | | | 141/63 |
| 8,146,623 | B2 * | 4/2012 | Tieben | H01L 21/67353 |
| | | | | 141/63 |
| 9,091,353 | B2 * | 7/2015 | Lo | F16K 15/026 |
| 9,895,723 | B2 * | 2/2018 | Iwamoto | H01L 21/67775 |
| 9,916,997 | B2 * | 3/2018 | Morihana | H01L 21/67393 |
| 2004/0045605 | A1 | 3/2004 | Floh et al. | |
| 2009/0266441 | A1 | 10/2009 | Sato | |
| 2010/0163452 | A1 * | 7/2010 | Lin | H01L 21/67393 |
| | | | | 206/711 |
| 2012/0309286 | A1 * | 12/2012 | Nakano | H01L 21/67389 |
| | | | | 454/305 |
| 2015/0294889 | A1 * | 10/2015 | Smith | B65D 85/38 |
| | | | | 206/701 |
| 2017/0271188 | A1 * | 9/2017 | Fuller | H01L 21/67379 |

* cited by examiner

SUBSTRATE STORAGE CONTAINER

CROSSED-REFERENCE TO RELATED APPLICATIONS

This application is the United States national phase of International Application No. PCT/JP2018/023312 filed Jun. 19, 2018, and claims priority to Japanese Patent Application No. 2017-138014 filed Jul. 14, 2017, the disclosures of which are hereby incorporated by reference in their entirety.

FIELD

The present invention relates to a substrate storage container provided with a valve body that controls the flow of gas to a container body.

BACKGROUND ART

A substrate storage container which stores substrates includes a container body, a lid that closes the opening of the container body, and a valve body that controls the flow of gas to the container body. The valve body has a check valve function, and includes a valve element and a metal elastic member for opening and closing the valve element (For example, refer to Japenese Patent Application Laid-open Publication No. 2008-066330 and Japenese Patent Application Laid-open Publication No. 2004-179449).

Since the check valve function of the valve body controls the flow of gas in only one direction, the valve body itself may be replaced, or the valve element and the elastic member may be replaced based on the flow direction of the gas.

[Patent Document 1] Japanese Patent Application Laid-open Publication No. 2008-066330

[Patent Document 2] Japanese Patent Application Laid-open Publication No. 2004-179449

DISCLOSURE OF INVENTION

Incidentally, in order to store the substrates in an airtight state, the substrate storage container is supplied with gas from the valve body and is discharged through the valve body, but residual substances adhering to the substrates may be discharged together with the supplied gas during processing of the stored substrates. Therefore, the metal elastic member of the valve body may become corroded by the residual material.

SUMMARY OF THE INVENTION

Therefore, the present invention has been made in view of the above problems, and an object of the present invention is to provide a substrate storage container that includes a valve body that can control the flow of gas without using a metal member.

Also, another object of the present invention is to provide a substrate storage container that includes a valve body that can control the flow of gas in both directions, such as supply gas or exhaust gas.

(1) One aspect of the present invention is a substrate storage container comprising a container body that stores substrates, a lid that closes an opening of the container body, and a valve body that controls gas flow to the container body, wherein the valve body includes a first cylindrical portion having one end communicating with outside of the container body, a second cylindrical portion having one end communicating with an interior of the container body and spaced apart from the other end of the first cylindrical portion, a plug member positioned between the other end of the first cylindrical portion and the other end of the second cylindrical portion, and an elastic body that covers at least the plug member and has an inner diameter equal to or smaller than the outer diameter of the plug member, and wherein gas flow to the container body is controlled by close contact between the plug member and the elastic body.

(2) In the above aspect (1), wherein the elastic body may have a substantially tubular shape having an internal passage, and the elastic body may create a seal between the first cylindrical portion and the plug member and between the plug member and the second cylindrical portion so that gas only flows through an internal passage of the first cylindrical portion, the internal passage of the elastic body, and an internal passage of the second cylindrical portion.

(3) In the above aspect (1) or (2), wherein when a positive pressure is applied to either the first cylindrical portion or the second cylindrical portion, the elastic body may expand to form a gap with the plug member which allows gas to flow to the container body, and when a positive pressure is not applied to the first cylindrical portion or the second cylindrical portion, the elastic body may be in close contact with the plug member and gas flow to the container body is blocked.

(4) In any one of the above aspects (1) to (3), wherein the first cylindrical portion may be formed in a fixing cylinder fitted in a through hole formed in the container body, wherein the second cylindrical portion may be formed in a holding cylinder combined with the fixing cylinder, and wherein the plug member may be provided on either the fixing cylinder or the holding cylinder.

(5) In any one of the above aspects (1) to (3), wherein the first cylindrical portion may be formed in a fixing cylinder fitted in a through hole formed in the container body, wherein the second cylindrical portion may be formed in an inner lid cylinder connected to a holding cylinder combined with the fixing cylinder, and wherein the plug member may be provided on any one of the fixing cylinder, the holding cylinder, or the inner lid cylinder.

(6) In any one of the above aspects (1) to (5), wherein the valve body has at least one filter that filters gas.

(7) In any one of the above aspects (1) to (3), wherein the valve body may be attached in a path of a gas flow path provided in the container body.

According to the present invention, a substrate storage container can be provided with a valve body that can control the flow of gas without using a metal member.

DESCRIPTION OF THE INVENTION

Figure 1:
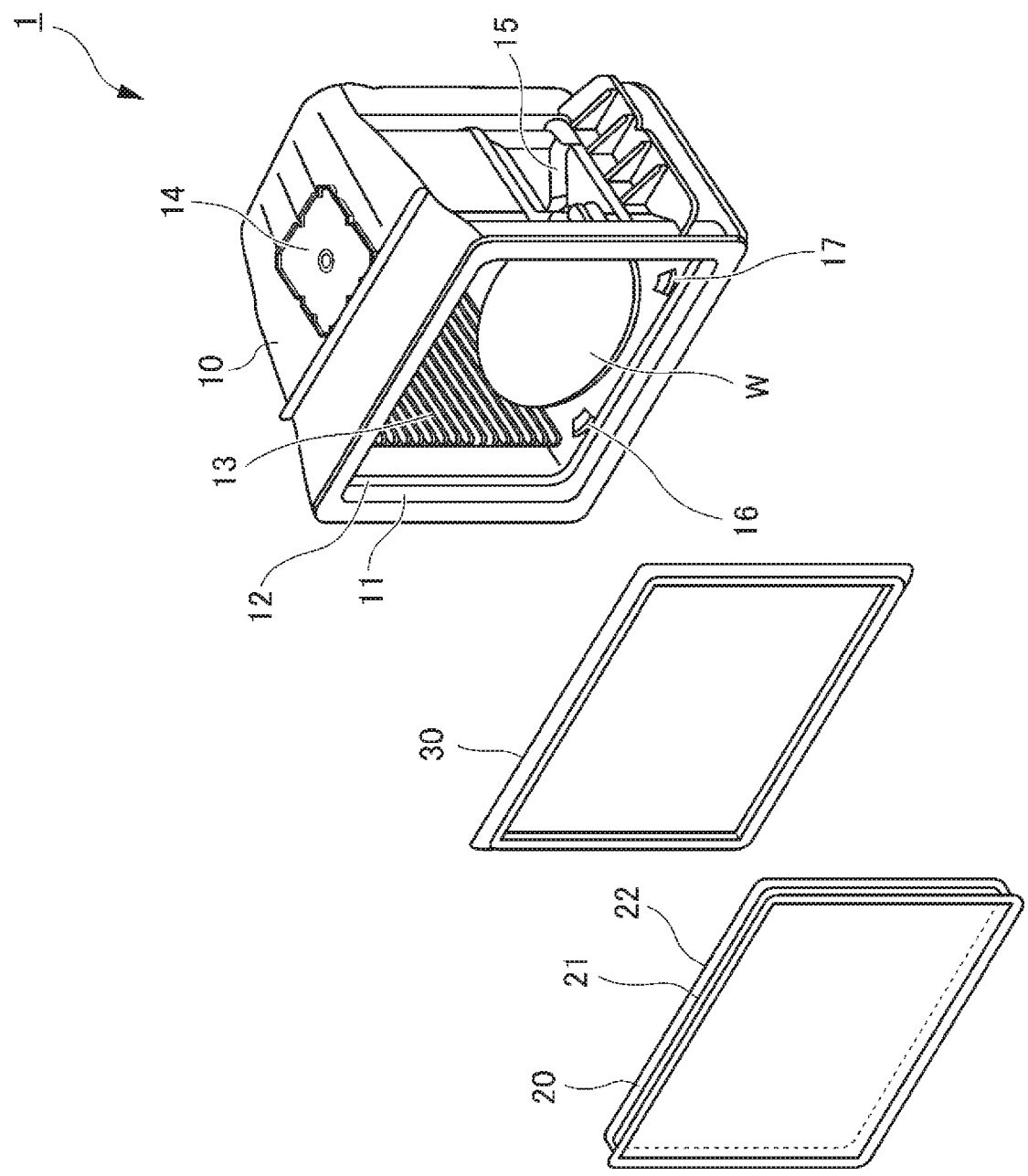
FIG. 1 is a schematic exploded perspective view showing a substrate storage container according to an embodiment of the present invention.

Hereinafter, embodiments of the present invention will be described in detail with reference to the drawings. In the embodiments of the present specification, the same members are denoted by the same reference numerals throughout.

FIG. 1 is a schematic exploded perspective view showing a substrate storage container 1 according to an embodiment of the present invention.

As shown in FIG. 1, the substrate storage container 1 includes a container body 10 that stores substrates W, a lid 20 that closes an opening 11 of the container body 10, and an annular packing 30 provided between the container body 10 and the lid 20.

The container body 10 is a box-like body, and is a front open type in which the opening 11 is formed on the front surface. The opening 11 is bent so as to have a level difference which spreads outward, and the surface of the level difference portion is formed on the inner peripheral edge of the front of the opening 11 as a seal surface 12 in contact with the packing 30. Note that the container body 10 is preferably a front open type because inserting substrates W having a diameter of 300 mm or 450 mm is easy, but may also be a bottom open type in which the opening 11 is formed on the bottom surface.

Supports 13 are disposed on both left and right sides of the interior of the container body 10. The supports 13 function so as to place and position the substrates W. A plurality of grooves are formed in the supports 13 in the height direction, and constitute so-called groove teeth. Then, the substrates W are placed on two groove teeth on the left and right sides of the same height. The material of the supports 13 may be the same as that of the container body 10, but different materials may also be used to improve cleaning properties and slidability.

Also, rear retainers (not shown) are disposed at the rear (back side) of the interior of the container body 10. If the lid 20 is closed, the rear retainers are paired with front retainers, which will be described later, to hold the substrates W. However, unlike with the present embodiment which has rear retainers, the supports 13 may have, for example, "<"-like-shaped or linear substrate holders on the back side of the groove teeth so that the substrates W are held by the front retainers and the substrate holders. The supports 13 and the rear retainers are provided on the container body 10 by insert molding, fitting, or the like.

The substrates W are supported by the supports 13 and stored in the container body 10. An example of the substrates W includes silicon wafers, but is not particularly limited, and may be quartz wafers, gallium arsenide wafers, or the like.

A robotic flange 14 is detachably provided at the center of the ceiling of the container body 10. In a clean state, the substrate storage container 1 is held by the robotic flange 14 by a transfer robot in a factory, and are transferred to processing devices for each process for processing the hermetically stored substrates W.

In addition, manual handles 15 that are gripped by an operator are detachably attached to the center portions of the outer surfaces of both side portions of the container body 10.

An air supply unit 16 and an exhaust unit 17 are provided on the bottom surface inside the container body 10, and a valve body 40 to be described later is attached to the bottom surface outside the container body 10. These components are configured to maintain the cleanliness of the inside of the substrate container 1 by supplying an inert gas such as nitrogen gas or dry air from the air supply unit 16 to the inside of the substrate container 1 closed by the lid 20 and discharging the gas from the exhaust unit 17 as necessary, thereby replacing the gas inside the substrate container 1, maintaining a low-humidity, airtight state, or blowing out impurities on the substrates W. Note that in addition to supplying the gas from the air supply unit 16, the exhaust unit 17 may be connected to a negative pressure (vacuum) generating device to forcibly discharge the gas from the exhaust unit 17.

Furthermore, whether or not the inside of the substrate storage container 1 has been replaced with the introduced gas can be confirmed by detecting the gas exhausted from the exhaust unit 17. Note that the air supply unit 16 and the exhaust unit 17 are preferably located at positions outside of the positions where they project onto the bottom surface of the substrates W, but the quantities and positions of the air supply unit 16 and the exhaust unit 17 are not limited to those illustrated, and may also be positioned at the four corners of the bottom surface of the container body 10. Also, the air supply unit 16 and the exhaust unit 17 may be attached to the lid 20 side.

On the other hand, the lid 20 has a substantially rectangular shape that is attached to the front surface of the opening 11 of the container body 10. The lid 20 has a locking mechanism which is not shown, and is locked by fitting a locking claw into a locking hole (not shown) formed in the container body 10. In addition, the lid 20 is detachably fitted or integrally formed with the elastic front retainers (not shown) that hold the front peripheral edges of the substrates W horizontally at the center.

Since the front retainers are portions that are in direct contact with the wafers, just like with the groove teeth and the substrate holders of the supports 13, materials with good cleaning properties and slidability are used. The front retainer can also be provided on the lid 20 by insert molding, fitting, or the like.

Then, an attachment groove 21 for attaching the packing 30 is formed in the lid 20. More specifically, a convex portion 22 smaller than the level difference portion of the opening 11 is formed in a substantially annular shape on the surface of the lid 20 on the container body 10 side, so that the attachment groove 21 having a substantially U-shaped cross section is formed in a substantially annular shape. When the lid 20 is attached to the container body 10, the convex portion 22 enters deeper than the level difference portion of the opening 11.

Examples of the material of the container body 10 and the lid 20 include thermoplastic resins such as polycarbonates, cycloolefin polymers, polyetherimides, polyether sulfones, polyether ether ketones, liquid crystal polymers, or the like. The thermoplastic resins may further include, as appropriate, a conductive agent made of conductive carbon, conductive fiber, metallic fiber, conductive polymer, or the like, various antistatic agents, ultraviolet absorbers, or the like.

Next, the packing 30 has a substantially annular shape corresponding to the front shape of the lid 20 (and the shape of the opening 11 of the container body 10), and in the present embodiment, has a substantially rectangular frame shape. However, the annular packing 30 may be in a substantially circular (ring) shape before being attached to the lid 20.

The packing 30 is disposed between the seal surface 12 of the container body 10 and the lid 20, and when the lid 20 is attached to the container body 10, the seal surface 12 and the lid 20 are in close contact with each other to ensure the airtightness of the substrate storage container 1, which reduces the entry of dust, moisture, etc. from the outside into the substrate storage container 1 as well as reduces gas leakage from the inside to the outside.

With respect to the material for the packing 30, elastic bodies such as thermoplastic elastomers including polyester elastomers, polyolefin elastomers, fluorine elastomers, urethane elastomers, or the like, fluororubber, ethylene propylene rubber, silicone rubber or the like can be used. From the viewpoint of improving adhesion, a predetermined amount of fillers made of carbon, glass fiber, mica, talc, silica, calcium carbonate, or the like, and resins such as polyethylene, polyamide, polyacetal, fluorine-based resin, silicone resin, or the like may be selectively added to these materials.

Figure 2A:
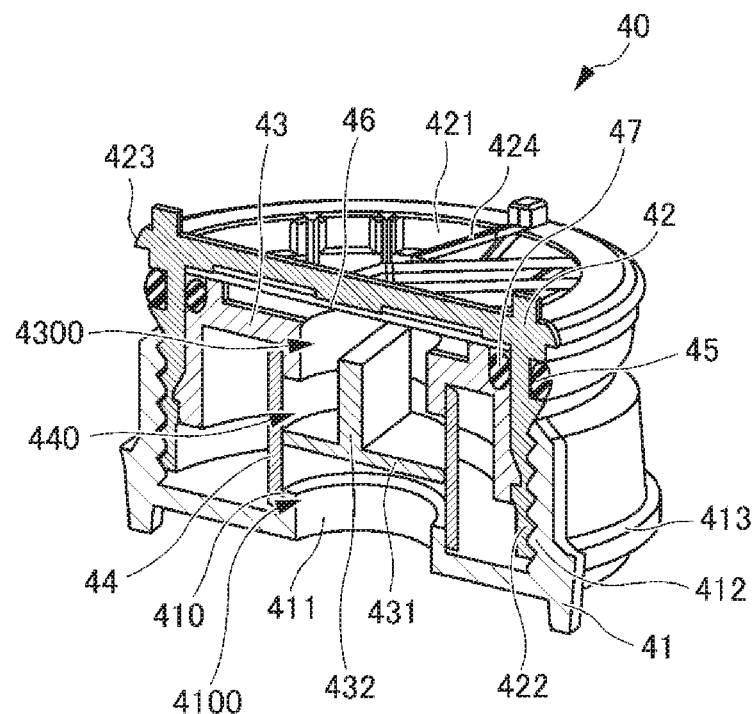
FIG. 2A shows a schematic cross-sectional view and FIG. 2B shows a cross-sectional view of a valve body.
Figure 2B:
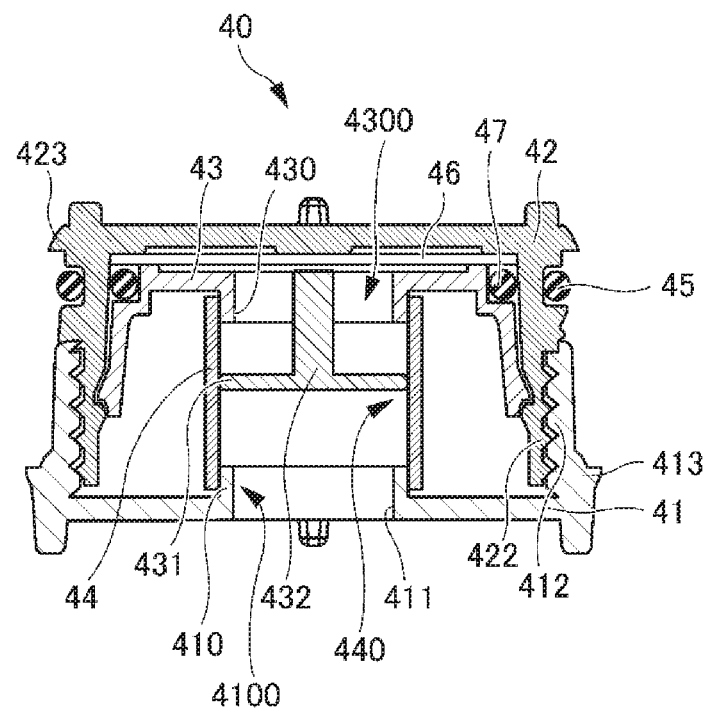
Figure 3A:
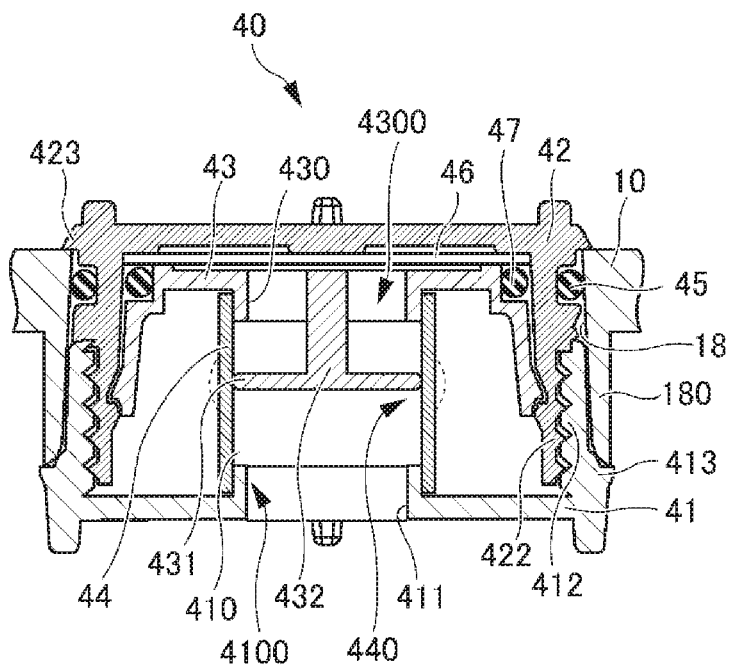
FIG. 3A is a schematic cross-sectional view of a valve body attached to a substrate storage container where (a) is a schematic cross-sectional view showing a state in which gas flow is blocked.
Figure 3B:
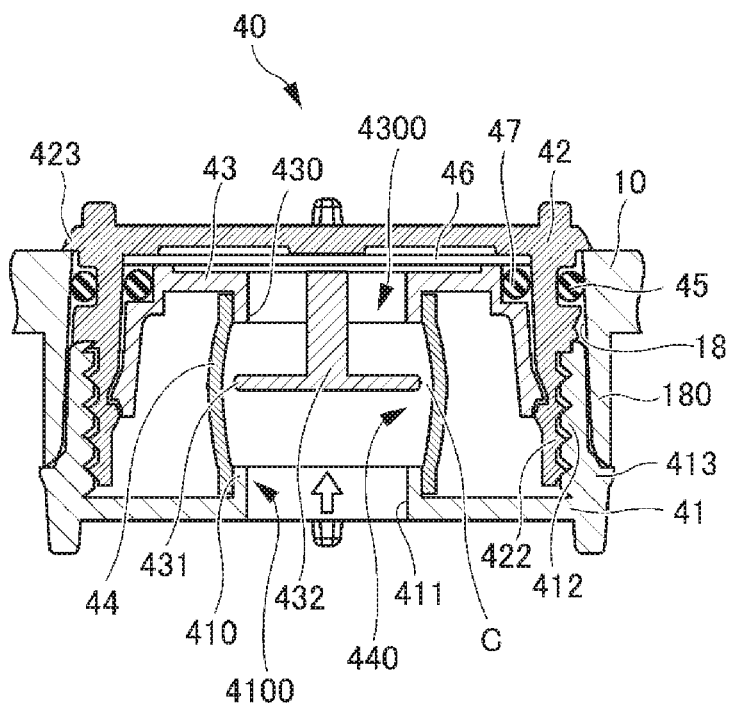
FIG. 3B is a schematic cross-sectional view showing a state in which gas flow is enabled.

Here, the valve body 40 will be described. FIG. 2A shows a schematic cross-sectional view and FIG. 2B shows a cross-sectional view of a valve body 40. FIG. 3A shows a schematic cross-sectional view of a valve body 40 attached to a substrate storage container showing a state in which gas flow is blocked, and FIG. 3B is a schematic cross-sectional view showing a state in which gas flow is enabled.

The valve body 40 controls the flow of gas to the container body 10, and when attached to the container body 10, the valve body 40 communicates with the air supply unit 16 or the exhaust unit 17 via a gas flow path (not shown).

As shown in FIGS. 2A and 2B, the valve body 40 has a fixing cylinder 41 fitted from below into a through hole 18 formed by a rib 180 of the container body 10 (see FIGS. 3A and 3B), and a holding cylinder 42 fitted into the through hole 18 from above through a seal member 45 and detachably screwed to the fixing cylinder 41 from above.

The fixing cylinder 41 is formed in a bottomed substantially cylindrical shape opening toward the inner side of the container body 10, and a screw groove 412 for attaching the holding cylinder 42 by screwing is formed on the inner peripheral surface of the fixing cylinder 41. Further, a substantially ring-shaped flange 413 extending radially outward is circumferentially provided on the outer peripheral surface of the fixing cylinder 41 so as to come into contact with a peripheral edge of the opening of the rib 180.

Moreover, the fixing cylinder 41 has a first cylindrical portion 410, one end of which communicates with the outside of the container body 10, formed at the center of the bottom portion thereof together with a ventilation port 411 for gas flow. The first cylindrical portion 410 rises from the edge of the ventilation port 411 and extends toward the holding cylinder 42 while communicating with the ventilation port 411.

On the other hand, the holding cylinder 42 is formed in a bottomed substantially cylindrical shape opening toward the outer side of the container body 10, and a substantially ring-shaped flange 423 extending radially outward is circumferentially provided on the outer peripheral surface of the holding cylinder 42, and is in contact with the opening peripheral edge of the through hole 18. Further, a screw groove 422 for attaching the fixing cylinder 41 by screwing is formed on the outer peripheral surface of the holding cylinder 42, and the screw groove 422 is screwed with the screw groove 412 of the fixing cylinder 41. However, the fixing cylinder 41 and the holding cylinder 42 need not be screwed together but may be attached by other methods such as press-fitting, locking, or the like.

Also, in the holding cylinder 42, partition ribs 424 for partitioning a plurality of ventilation ports 421 for gas flow are arranged in a substantially lattice shape or in a substantially radial shape on the inner side of the container body 10 (bottom surface), and a storage space for storing one or more than one filter 46 (to be described later) is formed on the back surface of the partition ribs 424.

Note that the holding cylinder 42 has a seal member 45 mounted on the outer peripheral surface thereof, which can block outside air or cleaning liquid entering the interior of the container body 10 from the space between the holding cylinder 42 and the inner peripheral surface of the through hole 18, and can also block gas leaking from the interior of the container body 10.

Incidentally, the valve body 40 also has an inner lid cylinder 43 that is also attached to the inner peripheral wall of the holding cylinder 42 through a seal member 47, and holds the filter 46 is also provided between the valve body 40 and the holding cylinder 42.

The inner lid cylinder 43 is formed in a bottomed substantially cylindrical shape opening toward the outer side of the container body 10, and the filter 46 is placed toward the inner side of the container body 10. Also, a protrusion is formed on the outer peripheral surface of the inner lid cylinder 43, by engaging it with a locking groove formed on the inner peripheral surface side of the holding cylinder 42, the inner lid cylinder 43 is coupled to and attached to the holding cylinder 42.

The inner lid cylinder 43 has one end which communicates with the inside of the container body 10, and a second cylindrical portion 430 which is formed so as to be provided apart from the other end of the first cylindrical portion 410. The second cylindrical portion 430 rises from the peripheral edge of the central opening while communicating with the ventilation ports 421, and extends toward the first cylindrical portion 410 formed in the fixing cylinder 41.

The inner lid cylinder 43 is positioned between the other end of the first cylindrical portion 410 and the other end of the second cylindrical portion 430 and includes a substantially disc-shaped plug member 431 that is equal to or larger than the outer diameter of the first cylindrical portion 410 or the second cylindrical portion 430. Note that in the present embodiment, the outer diameter of the first cylindrical portion 410, the outer diameter of the second cylindrical portion 430, and the outer diameter of the substantially disc-shaped plug member 431 are all formed to have the same diameter.

Then, the substantially disc-shaped plug member 431 is supported from the inside of the second cylindrical portion 430 and is provided at the end of a support column 432 protruding beyond the other end from the second cylindrical portion 430. However, the support column 432 may be supported from the first cylindrical portion 410 side and protrude from the other end of the first cylindrical portion 410.

The fixing cylinder 41, the holding cylinder 42, and the inner lid cylinder 43 are formed from, for example, thermoplastic resins such as polycarbonate, polyetherimide, polyetheretherketone, liquid crystal polymers, or the like. Also, the seal members 45 and 47 are made of a material such as fluorine rubber, NBR rubber, urethane rubber, EPDM rubber, silicone rubber, or the like, and O-rings or the like may be used as the seal members.

Further, the valve body 40 has an elastic body 44 that covers at least the other end of the first cylindrical portion 410, the plug member 431, and the other end of the second cylindrical portion 430. The elastic body 44 has a substantially tubular shape having an internal passage 400 having an inner diameter equal to or smaller than the outer diameter of the substantially disc-shaped plug member 431, and is attached across the other end of the first cylindrical portion 410 and the other end of the second cylindrical portion 430 so as to be in close contact with the plug member 431.

In other words, the space between the first cylindrical portion 410 and the plug member 431 and the space between the plug member 431 and the second cylindrical portion 430 are securely sealed so that the gas to be supplied or exhausted flows only through an internal passage 4100 (hereinafter referred to as "first passage 4100") of the first cylindrical portion 410, the internal passage 400 of the elastic body 44, and an internal passage 4300 (hereinafter referred to as "second passage 4300") of the second cylindrical portion 430. Note that since the inner diameter of the elastic body 44 is reduced by attaching the elastic body 44 in a stretched state, even if the inner diameter is equal to the outer diameter of the plug member 431, the adhesiveness to the plug member 431 is improved.

As the material for the elastic body 44, various types of rubber, thermoplastic elastomer resins, or the like can be used. For example, thermoplastic elastomers such as polyester elastomers, polyolefin elastomers, fluorine elastomers, urethane elastomers, fluorine rubber, ethylene propylene rubber, silicone rubber, or the like can be used.

Then, that filter 46 filters the gas supplied or discharged, and is selected from porous membranes made of tetrafluoroethylene, polyester fiber, fluororesin, or the like, molecular filtration filters made of glass fiber or the like, chemical filters in which a chemical adsorbent is supported on a filter medium such as activated carbon fibers or the like.

One or more filters 46 may be held between the holding cylinder 42 and the inner lid cylinder 43. Note that if using multiple filters 46, they may be of the same type, but combining materials having different properties is more preferable because contamination of organic matter in addition to particles may also be prevented. For example, when cleaning the container body 10, permeation of liquids may be further suppressed by using a hydrophobic or hydrophilic material for one of the filters 46 because the filter 46 may also have the function of suppressing the passage of liquids so that liquids such as water or a cleaning liquid do not remain.

Finally, a state in which the valve body 40 controls the flow of gas will be described.

In FIG. 3A, when a positive pressure is not applied to the first cylindrical portion 410 and the second cylindrical portion 430, the elastic body 44 is in close contact with the plug member 431 and blocks the flow of gas to either side.

As shown by the arrow in FIG. 3B, when a positive pressure of a predetermined value or more is applied to the first cylindrical portion 410, for example, the elastic body 44 elastically deforms and expands according to the magnitude of the positive pressure, thereby forming a gap C between the elastic body 44 and the plug member 431. Then, gas from the first cylindrical portion 410 side passes through the gap C, flows to the second cylindrical portion 430 side, and is supplied to the inside of the container body 10.

Conversely, even if a positive pressure of a predetermined value or more is applied to the second cylindrical portion 430, the elastic body 44 similarly expands to form a gap C between the elastic body 44 and the plug member 431. Then, gas from the second cylindrical portion 430 side passes through the gap C, flows to the first cylindrical portion 410 side, and is discharged to outside of the container body 10.

In this manner, the valve body 40 of the embodiment neither blocks nor enables the flow of the gas from either one side or the other, but instead can block or enable the flow of gas in both directions. Then, the predetermined value of the pressure at which the gas can flow can be adjusted by changing the material, the hardness and/or thickness of the elastic body 44, and/or the distance between the other end of the first cylindrical portion 410 and the other end of the second cylindrical portion 430.

As described above, a substrate storage container 1 according to an embodiment of the present invention is a substrate storage container 1 comprising a container body 10 that stores substrates W, a lid 20 that closes an opening 11 of the container body 10, a valve body 40 that controls the flow of gas to the container body 10, wherein the valve body 40 includes a first cylindrical portion 410 having one end communicating with the outside of the container body 10, a second cylindrical portion 430 having one end communicating with the interior of the container body 10 and spaced apart from the other end of the first cylindrical portion 410, a plug member 431 positioned between the other end of the first cylindrical portion 410 and the other end of the second cylindrical portion 430, and an elastic body 44 that covers at least the plug member 431 and has an inner diameter equal to or smaller than the outer diameter of the plug member 431, and wherein gas flow to the container body 10 is controlled by close contact between the plug member 431 and the elastic body 44.

As a result, when gas is introduced from one side of the valve body 40 (becomes a positive pressure) and reaches a predetermined pressure value, since the elastic body 44 swells and a gap C is formed between the elastic body 44 and the stopper 431, the introduced gas is supplied to the other side of the valve body 40.

Moreover, since the substrate storage container 1 includes a valve body 40 that does not use a metallic member, even if there is a metal corrosive residual material on the substrates W to be stored, the problem of metal corrosion does not occur, and the valve body 40 is not likely to become inoperable.

Further, since the substrate storage container 1 includes a valve body 40 that controls the flow of bidirectional gas, by simply attaching the same valve body 40 to the through hole 18 of the container body 10 as appropriate, regardless of the position and number of air supply units 16 and exhaust units 17, coping with all of the gas supply and exhaust routes is possible.

In addition, a humidity retention test was performed using the substrate storage container 1 of the embodiment, but no significant difference in humidity reduction over time was found over a conventional one.

As mentioned above, although a preferred embodiment of this invention has been explained in full detail, the present invention is not limited to the embodiment described above, and various modifications and changes can be made within the scope of the gist of the present invention described in the claims.

Modifications

In the above embodiment, the elastic body 44 is attached so as to cover the other end of the first cylindrical portion 410 and the other end of the second cylindrical portion 430, but the attachment structure of the elastic body 44 is not limited thereto.

Figure 4A:
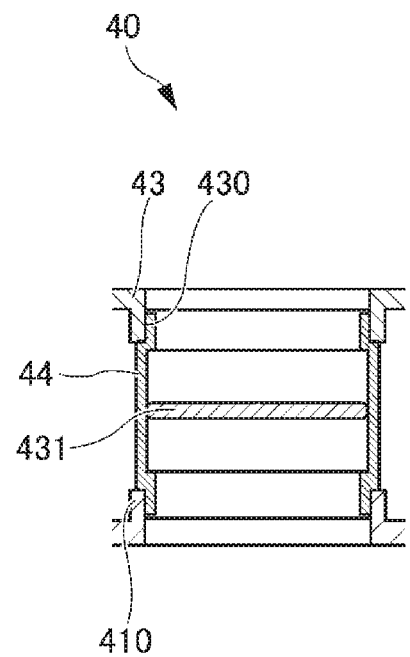
FIG. 4A is a schematic cross-sectional view showing a first modification of an elastic body attachment structure and FIG. 4B is a second modification.
Figure 4B:
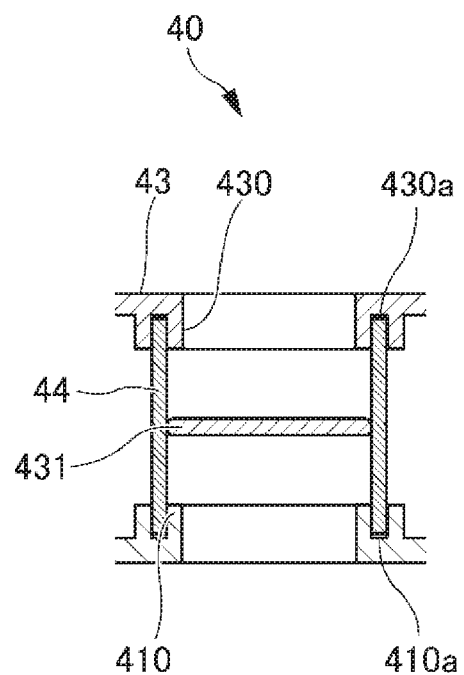

FIG. 4A is a schematic cross-sectional view showing a first modification of the elastic body 44 attachment structure and FIG. 4B is a second modification.

In the first modification, the elastic body 44 is attached so as to fit inside the other end of the first cylindrical portion 410 and the other end of the second cylindrical portion 430, respectively. At this time, a step portion may be formed so that the elastic body 44 can be locked at a position corresponding to the end surfaces of the first cylindrical portion 410 and the second cylindrical portion 430.

In the second modification, substantially ring-shaped grooves 410a and 430a are formed at the tips on the other end side of the first cylindrical portion 410 and the second cylindrical portion 430, and the elastic body 44 may be attached by fitting the edges of the elastic body 44 into the substantially ring-shaped grooves 410a and 430a. Note that the attachment structures of the elastic bodies 44 in the embodiment the first modification, and the second modification may be used in combination.

Moreover, in the above embodiment, the elastic body 44 is configured to operate at substantially the same pressure in both directions, but may be configured to have different bidirectional operating (opening) pressures.

Figure 5A:
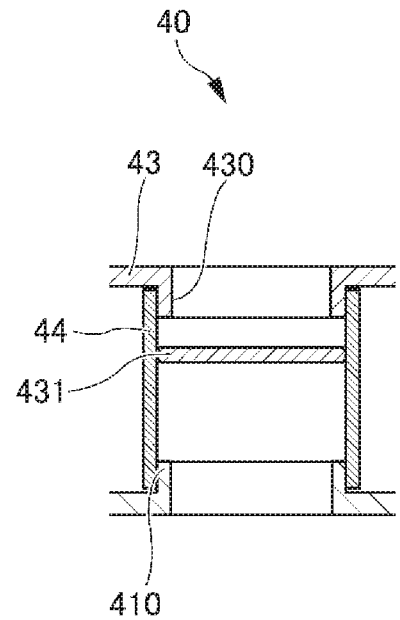
FIG. 5A is a schematic cross-sectional view showing a third modification and FIG. 5B is a fourth modification of a valve body with different bidirectional operating pressures.
Figure 5B:
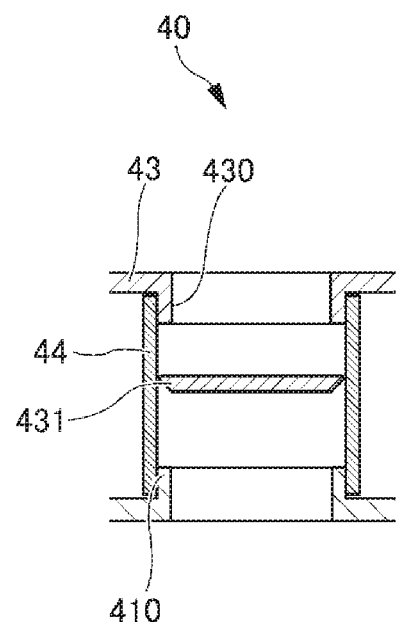
Figure 6A:
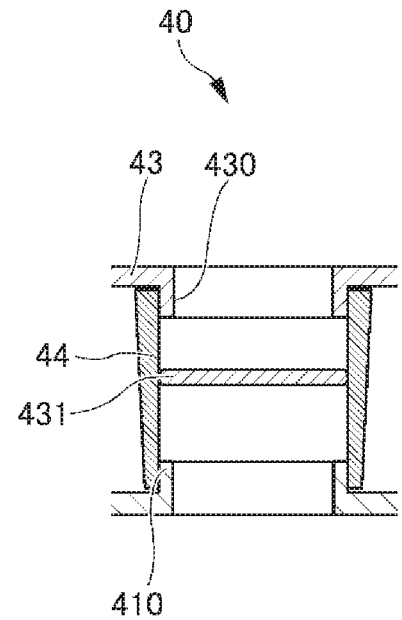
FIG. 6A is a schematic cross-sectional view showing a fifth modification and FIG. 6B is a sixth modification of a valve body with different bidirectional operating pressures.
Figure 6B:
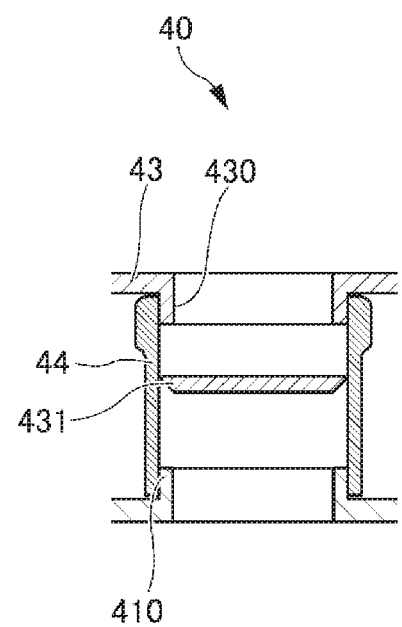

FIG. 5A is a schematic cross-sectional view showing a third modification and FIG. 5B is a fourth modification of a valve body 40 with different bidirectional operating pressures. FIG. 6A is a schematic cross-sectional view showing a fifth modification and FIG. 6B is a sixth modification of a valve body 40 with different bidirectional operating pressures.

In the third modification, the plug member 431 is positioned so as to be offset toward the second cylindrical portion 430 side. As a result, since the pressure receiving area of the pressure applied to the elastic body 44 is wider on the first cylindrical portion 410 side than on the second cylindrical portion 430 side, the first cylindrical portion 410 side of the elastic body 44 is easier to deform as compared with when the plug member 431 is positioned in the middle of the other end of the first cylindrical portion 410 and the other end of the second cylindrical portion 430, and conversely, the second cylindrical portion 430 side of the elastic body 44 is harder to deform.

In other words, the operating pressure that can be supplied from the first cylindrical portion 410 side to the inside of the container body 10 can be lower than the operating pressure that can be discharged from the second cylindrical portion 430 side to the outside of the container body 10.

In the fourth modification, the first cylindrical portion 410 side of the plug member 431 is chamfered. Also, with this structure, the pressure receiving area of the pressure applied to the elastic body 44 can be varied.

In the fifth and sixth modifications, the operating pressure is varied by making a difference in the elastic modulus rather than making a difference in the pressure receiving area as in the third and fourth modifications. As a means for varying the elastic modulus, the hardness may be varied, the thickness may be varied, or these may be done in combination. For example, in the fifth modification, the elastic body 44 is formed in a substantially tapered shape, and in the sixth modification, the elastic body 44 is formed in a substantially multi-leveled shape of two or more levels so that the thickness of the elastic body 44 in each of the modifications is thin by the first cylindrical portion 410 side and thicker by the second cylindrical portion 430 side. Note that in the sixth modification, the plug member 431 is chamfered on the first cylindrical portion side 410.

By making the configurations of the third through sixth modifications, the operating pressure that can be supplied from the first cylindrical portion 410 side to the inside of the container body 10 and the operating pressure that can be discharged from the second cylindrical portion 430 side to the outside of the container body 10 can be made different. Note that the third through sixth modifications may also be combined as appropriate.

Moreover, in the above embodiment, the outer diameter of the first cylindrical portion 410, the outer diameter of the second cylindrical portion 430, and the outer diameter of the substantially disc-shaped plug member 431 were all formed so as to have the same diameter, but as long as the outer diameter of the substantially disc-shaped plug member 431 is larger than at least one of the outer diameter of the first cylindrical portion 410 and the outer diameter of the second cylindrical portion 430, they may also be formed with different diameters. In addition, the first cylindrical portion 410, the second cylindrical portion 430, and the elastic body 44 are not limited to a substantially tubular shape, and may have any shape as long as the flow of gas to the container body 10 can be controlled by the close contact between the plug member 431 and the elastic body 44, and for example, if the shape is a polygon, the corresponding inner diameter corresponding to the circular diameter of the elastic body 44 may be equal to or smaller than the corresponding outer diameter of the plug member 431.

Further, in the above embodiment, the holding cylinder 42 may be combined with the inside of the fixing cylinder 41 fitted in the through hole 18, or conversely, the fixing cylinder 41 may be combined with the inside of the holding cylinder 42 fitted in the through hole 18. Also, the valve body 40 has the inner lid cylinder 43, but the second cylindrical portion 430 may be formed directly on the holding cylinder 42 without the inner lid cylinder 43. In this case, the plug member 431 may be provided from the fixing cylinder 41 or the holding cylinder 42 via the support column 432, and the filter 46 may be directly bonded or welded to the holding cylinder 42.

Also, in the above embodiment, the filter 46 may be disposed separately from the valve body 40 so as to be in a gas flow path from a gas supply source to a gas discharge port inside the container body 10.

Second Embodiment

Incidentally, in the above embodiment, the valve body 40 is configured so as to be attached to the through hole 18 formed in at least one of the container body 10 and the lid 20, but may also be configured to be attached to a gas flow path (pipe) provided in the container body 10 or the like, e.g. in the middle of a gas flow path communicating with at least one of the air supply unit 16 and the exhaust unit 17.

Figure 7:
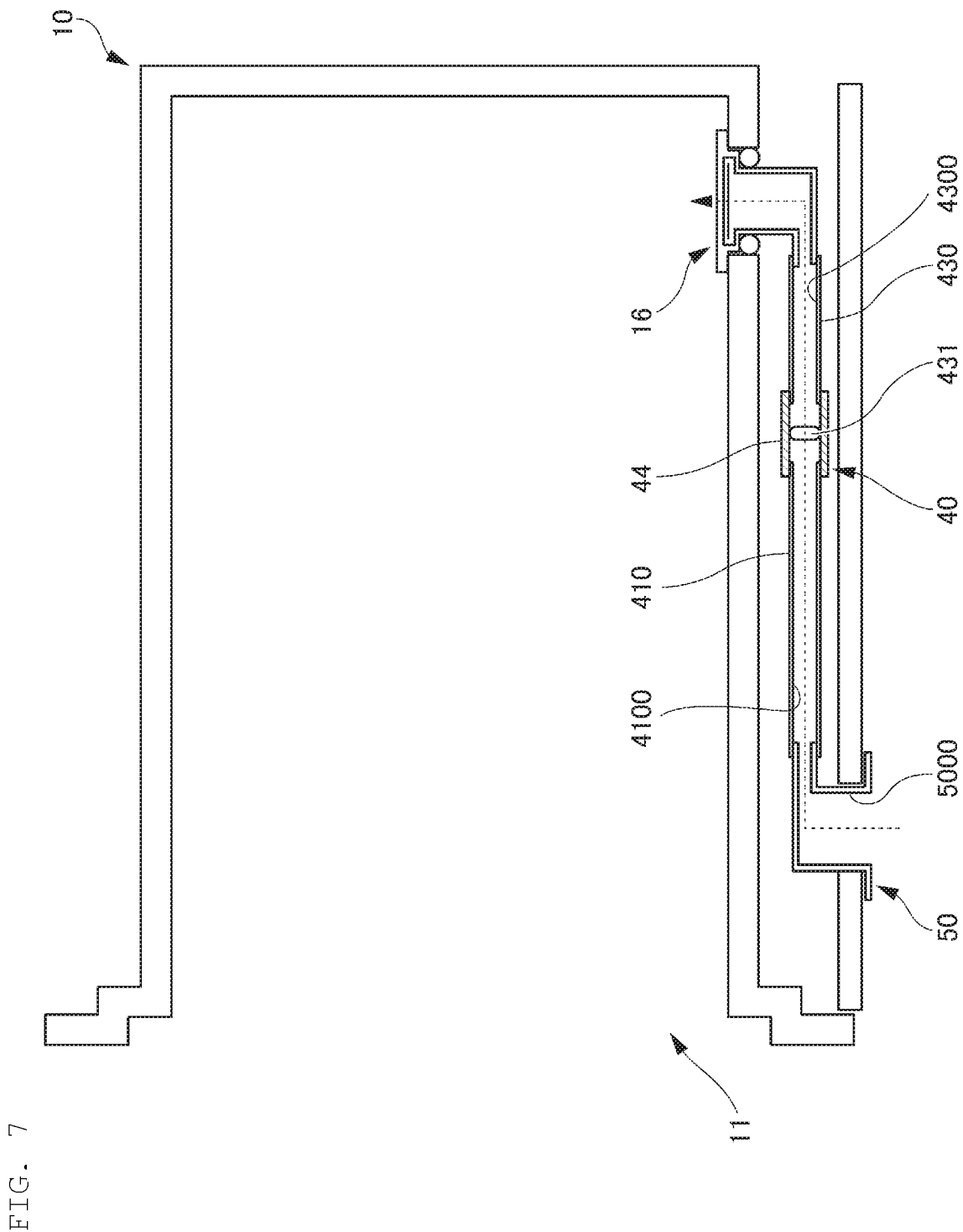
FIG. 7 is a schematic cross-sectional view showing a valve body in a container body according to a second embodiment.

FIG. 7 is a schematic cross-sectional view showing a valve body 40 in a container body 10 according to a second embodiment.

As shown in FIG. 7, the first cylindrical portion 410 is configured as one end of a pipe which is located on the opening 11 side of the container body 10 and communicates with a gas introducing portion 50 that is connected to a gas supply pipe from an external gas supply source; the second cylindrical portion 430 is configured as one end of a pipe that is located on the back side of the container body 10 and communicates with the air supply unit 16 or the exhaust unit 17; and a substantially disc-shaped plug member 431 is provided between the first cylindrical portion 410 and the second cylindrical portion 430 and an elastic body 44 is provided so as to cover them, thereby a substantially pipe-like configuration may be configured.

At this time, the first cylindrical portion 410 and the second cylindrical portion 430 may be a pipe made of a resin having high rigidity or may be a flexible tube.

Even in the substrate storage container 1 of the second embodiment, since the valve body 40 which does not use a metallic member is provided, even if there is a metal corrosive residual material on the substrates W to be stored, the problem of metal corrosion does not occur, and the valve body 40 is not likely to become inoperable.

Also, since the distance from the gas introducing portion 50 to the valve body 40 through the first cylindrical portion 410 is long, and the internal passage 5000 of the gas introducing portion 50 and the first passage 4100 of the first cylindrical portion 410 are bent in a substantially right angle direction to each other, then even if the container body 10 is washed with a liquid, the liquid does not easily reach the valve body 40, and water remaining after the container body 10 is dried can be prevented. Then, liquid does not reach the air supply unit 16 and the exhaust unit 17 on the back side of the valve body 40 (plug member 431).

The invention claimed is:

1. A substrate storage container comprising:
   a container body that stores substrates,
   a lid that closes an opening of the container body, and
   a valve body that controls gas flow to the container body,
   wherein the valve body comprises:
   a first cylindrical portion having a first end communicating with an outside of the container body,
   a second cylindrical portion having a first end communicating with an interior of the container body and spaced apart from a second end of the first cylindrical portion,
   a plug member positioned between the second end of the first cylindrical portion and a second end of the second cylindrical portion, and
   an elastic body that covers at least the plug member and has an inner diameter equal to or smaller than an outer diameter of an entirety of the plug member,
   wherein gas flow to the container body is controlled by close contact between the plug member and the elastic body.

2. The substrate storage container according to claim 1, wherein the elastic body has a substantially tubular shape having an internal passage, and the elastic body creates a seal between the first cylindrical portion and the plug member and between the plug member and the second cylindrical portion so that gas only flows through an internal passage of the first cylindrical portion, the internal passage of the elastic body, and an internal passage of the second cylindrical portion.

3. The substrate storage container according to claim 2, wherein when a positive pressure is applied to either the first cylindrical portion or the second cylindrical portion, the elastic body expands to form a gap with the plug member which allows gas to flow to the container body, and when a positive pressure is not applied to the first cylindrical portion or the second cylindrical portion, the elastic body is in close contact with the plug member and gas flow to the container body is blocked.

4. The substrate storage container according to claim 2, wherein the first cylindrical portion is formed in a fixing cylinder fitted in a through hole formed in the container body,
   wherein the second cylindrical portion is formed in a holding cylinder combined with the fixing cylinder, and
   wherein the plug member is provided on either the fixing cylinder or the holding cylinder.

5. The substrate storage container according to claim 2, wherein the first cylindrical portion is formed in a fixing cylinder fitted in a through hole formed in the container body,
   wherein the second cylindrical portion is formed in an inner lid cylinder connected to a holding cylinder combined with the fixing cylinder, and
   wherein the plug member is provided on any one of the fixing cylinder, the holding cylinder, or the inner lid cylinder.

6. The substrate storage container according to claim 2, wherein the valve body has at least one filter that filters gas.

7. The substrate storage container according to claim 2, wherein the valve body is attached in a path of a gas flow path provided in the container body.

8. The substrate storage container according to claim 1, wherein when a positive pressure is applied to either the first cylindrical portion or the second cylindrical portion, the elastic body expands to form a gap with the plug member which allows gas to flow to the container body, and when a positive pressure is not applied to the first cylindrical portion or the second cylindrical portion, the elastic body is in close contact with the plug member and gas flow to the container body is blocked.

9. The substrate storage container according to claim 8, wherein the first cylindrical portion is formed in a fixing cylinder fitted in a through hole formed in the container body,
   wherein the second cylindrical portion is formed in a holding cylinder combined with the fixing cylinder, and
   wherein the plug member is provided on either the fixing cylinder or the holding cylinder.

10. The substrate storage container according to claim 8, wherein the first cylindrical portion is formed in a fixing cylinder fitted in a through hole formed in the container body,
    wherein the second cylindrical portion is formed in an inner lid cylinder connected to a holding cylinder combined with the fixing cylinder, and
    wherein the plug member is provided on any one of the fixing cylinder, the holding cylinder, or the inner lid cylinder.

11. The substrate storage container according to claim 8, wherein the valve body has at least one filter that filters gas.

12. The substrate storage container according to claim 8, wherein the valve body is attached in a path of a gas flow path provided in the container body.

13. The substrate storage container according to claim 1, wherein the first cylindrical portion is formed in a fixing cylinder fitted in a through hole formed in the container body,
    wherein the second cylindrical portion is formed in a holding cylinder combined with the fixing cylinder, and
    wherein the plug member is provided on either the fixing cylinder or the holding cylinder.

14. The substrate storage container according to claim 13, wherein the valve body has at least one filter that filters gas.

15. The substrate storage container according to claim 1, wherein the first cylindrical portion is formed in a fixing cylinder fitted in a through hole formed in the container body, wherein the second cylindrical portion is formed in an inner lid cylinder connected to a holding cylinder combined with the fixing cylinder, and wherein the plug member is provided on any one of the fixing cylinder, the holding cylinder, or the inner lid cylinder.

16. The substrate storage container according to claim 15, wherein the valve body has at least one filter that filters gas.

17. The substrate storage container according to claim 1, wherein the valve body has at least one filter that filters gas.

18. The substrate storage container according to claim 1, wherein the valve body is attached in a path of a gas flow path provided in the container body.

\* \* \* \* \*